United States Patent [19]

Borras et al.

[11] Patent Number: 4,484,153

[45] Date of Patent: Nov. 20, 1984

[54] VOLTAGE CONVERTER FOR A FREQUENCY SYNTHESIZER

[75] Inventors: Jaime A. Borras, Hialeah; Ruben J. Gonzalez, Miami, both of Fla.; Daniel M. Smith, Schaumburg, Ill.; Jose I. Suarez, Miami, Fla.; Alan M. Victor, Cooper City, Fla.; Alfred B. Wieczorek, Plantation, Fla.

[73] Assignee: Motorola, Inc., Schaumburg, Ill.

[21] Appl. No.: 251,559

[22] Filed: Apr. 6, 1981

[51] Int. Cl.³ .............................................. H03L 7/18
[52] U.S. Cl. ........................................ 331/10; 331/16; 331/17; 331/25; 331/36 C
[58] Field of Search ..................... 331/10, 11, 12, 16, 331/17, 25, 36 C

[56] References Cited

U.S. PATENT DOCUMENTS

| | | | |
|---|---|---|---|
| 3,621,451 | 11/1971 | Yokoyama et al. | 331/10 X |
| 3,882,403 | 5/1975 | Gerken | 331/1 A |
| 3,959,737 | 5/1976 | Tanis | 331/1 A |
| 3,983,506 | 9/1976 | Rettinger, Jr. et al. | 331/17 |

FOREIGN PATENT DOCUMENTS

1466218 11/1969 Fed. Rep. of Germany ........ 331/11

Primary Examiner—Siegfried H. Grimm
Attorney, Agent, or Firm—Joseph T. Downey; Edward M. Roney; James W. Gillman

[57] ABSTRACT

In a frequency synthesizer phase locked loop including a reference oscillator, a variable reference divider ($\div M$), a sample and hold phase detector, a loop filter, a voltage controlled oscillator and a variable divider ($\div N$), a voltage converter for controlling the voltage of a control input to the voltage controlled oscillator is disclosed. In the preferred embodiment, the voltage converter has its input connected to the output of a first reference divider in the variable reference divider ($\div M$) and its output connected to a control input (varactor diode) of the voltage controlled oscillator. The voltage converter clamps the divider reference signal from the first reference divider and provides a negative voltage level output to bias the varactor diode of the voltage controlled oscillator. Thus, the tuning range of the frequency synthesizer is increased.

3 Claims, 8 Drawing Figures

PRIOR ART

VOLTAGE CONVERTER FOR A FREQUENCY SYNTHESIZER

BACKGROUND OF THE INVENTION

1. Field of the Invention

This invention relates generally to the field of frequency synthesizer systems and more particularly to such systems for use in communication transceivers. It further relates to a voltage converter for synthesized transceivers.

2. Description of the Prior Art

It is recognized that for many years there has been an ever increasing demand for FM two-way portable radios. This stems from the increasing use of portable radio communications in business, industry and government. The level of sophistication of the communication networks utilized by various institutions has constantly risen and many networks utilize some frequencies for local communications and other frequencies for longer range communications to a central location.

With the increasing use by many institutions of more sophisticated communications systems has come the demand for the capability of the portable transceivers to operate over a much larger number of frequencies. The majority of two-way FM portable radios currently in use today are those which employ conventional crystal controlled frequency channel elements. Thus, as each portable radio is required to either transmit or receive on more than one frequency an additional crystal controlled channel element must be included and electrically actuated so that both transmission and/or reception can occur.

As is the case with the several networks or systems, many different frequency combinations are grouped into communication channels from the available frequencies within a given area. Thus, any portable transceiver customer must specify to the manufacturer the desired pairs of receive and transmit frequencies for the several communication channels which are required in portable transceivers for a selected area. With such an order, the corresponding crystals to enable two-way communication on those channels must be manufactured and inserted into the transceiver. Frequently, design modifications must be made to accomodate the additional channel elements resulting in an increased size and weight of unit and a greatly increased cost.

The required long lead time for the manufacture of multifrequency transceivers to meet the market demand has caused a general trend toward the use of frequency synthesis in the design of FM two-way portable radios. A high order of accuracy of frequency control for a transceiver may be achieved by crystal control of the conversion oscillator. However, the multiple-frequency operation of the transceiver would call for a large number of crystals which is especially true where the transmit and receive frequencies are not identical. This difficulty may be reduced for certain frequency combinations by the use of a switched crystal frequency generator, a device in which the harmonics and subharmonics of one or more oscillators are mixed to provide a multiplicity of output frequencies. All of the resulting output frequencies are harmonically related to a subharmonic of the one or more master oscillators. The combination of a master oscillator signal with a secondary signal in a suitable mixer can provide the choice of a number of controlled frequencies. This reduces the number of crystals necessary to achieve several controlled frequencies.

However, there remains the difficulty of having only a restricted set of possible frequency combinations, whereas the customer may require unique combinations for his communication network. If a stable variable-frequency oscillator is substituted for a fixed crystal oscillator and a digital frequency synthesis technique is employed, a virtually unlimited number of discrete frequencies directly related to the frequency of the master oscillator are available. Instead of providing a plurality of individual channel elements suitable for each individual user's purpose, a manufacturer can provide one or more crystal controlled oscillators and a programmable memory which can be modified at the factory to conform to an individual user's required frequencies. This enables a manufacturer to assemble virtually all of his transceiver units in the same way and near the last step in the manufacturing process insert the memory programmed to the individual user's frequency requirements.

As will be described in greater detail, the programmable memory provides a series of numerical divisors which modify an output signal from a voltage controlled oscillator to cause tuning to any of a number of various frequencies. The use of digital frequency synthesizers is known in the art of radio transmitters and receivers but it has only recently been incorporated into the operation for two-way portable radios.

One of the basic problems with the use of frequency synthesized portable radios is the limited power available for the portable hand-held units. Thus, any frequency synthesis system must not be wasteful of the limited battery capacity available in the portable units. In addition, it has been found that various design implementations of digital frequency synthesizers do not meet the rigid specifications which are applied to radios which employ crystal controlled channel elements. It is well recognized in the art that crystal controlled channel elements produce extremely well defined frequencies. Digital frequency synthesizers can provide the same degree of accurate tuning as can the crystal controlled channel elements. But, the replacement of crystal controlled channel elements by a frequency synthesis system might ordinarily result in some degradation in the performance specification as, for example, adjacent channel selectivity.

The problem is therefore to find a digital frequency synthesized transceiver system for portable transceivers which will provide the size reduction, cost efficiency, power conservation and programmability that a multitude of users require yet can stay within the rigid performance specifications that apply to the use of crystal controlled elements.

Figure 1:
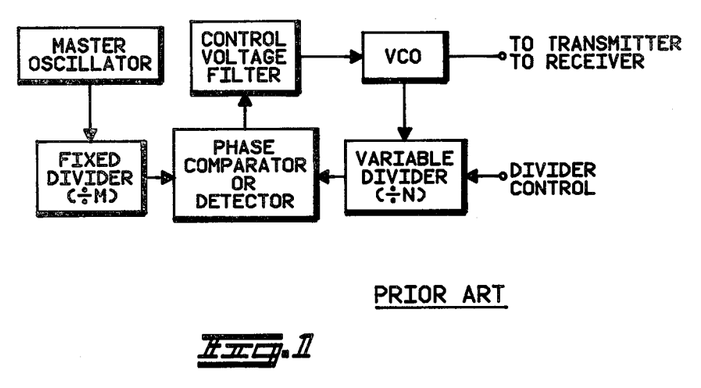
FIG. 1 is a functional block diagram of a prior art digital frequency synthesizer system.

Although too general and therefore not suitable to solve the problem, a block diagram of a known digital frequency synthesizer is shown in FIG. 1. A basic element of frequency synthesis systems is the phase-lock loop circuit in which the output of a voltage-controlled oscillator (VCO) is constantly compared with the frequency of the master crystal oscillator. Any unwanted change or drift in frequency of the variable controlled oscillator with respect to the master oscillator is detected by the phase comparator. When such a phase difference exists, the phase detector generates a control voltage which returns the VCO to the correct frequency.

Normally, the output signal of the master crystal oscillator is applied to a frequency divider that divides that signal by a fixed integer M and provides a square-wave output reference signal at 1/Mth the frequency of the master oscillator. Similarly, the output signal of the voltage-controlled oscillator is divided by a variable divider which produces a signal at 1/Nth the frequency of the VCO. This signal is compared with a reference signal which may be a square wave from the fixed M divider in a phase comparator. Any phase difference is detected and applied through an integrating circuit and a low-pass filter to the voltage-controlled oscillator. This phase difference signal, after being processed and filtered provides a DC control voltage that is highest when the phase difference is greatest. When the signals are equal and in phase in the comparator, the loop is said to be "locked."

The output frequency of the synthesizer can be changed by varying the divide ratio of the variable divider N. When a new frequency is within the capture range of the phase-locked loop, the control voltage will change to bring the frequency of the VCO to the new value demanded by the setting of the variable divider. If a new frequency is outside the capture range of the circuit, the VCO will be swept through its entire operating range, and as the VCO frequency then enters the capture range of the phase-locked loop, the loop will take over frequency control and lock on the desired frequency.

SUMMARY OF THE INVENTION

It is an object of the present invention to provide a voltage converter to enhance the performance of a frequency synthesizer.

It is another object of the present invention to provide a system for expanding the tuning region of a frequency synthesizer.

In a frequency synthesizer, including a phase locked loop in which a phase detector responsive to frequency signals from a reference oscillator and the signal output of a voltage controlled oscillator generates a control voltage supplied to a varactor diode in the voltage controlled oscillator, a voltage converter is coupled to the phase locked loop for modifying the control voltage to enhance the tuning range of the synthesizer.

DESCRIPTION OF THE PREFERRED EMBODIMENT

Figure 2:
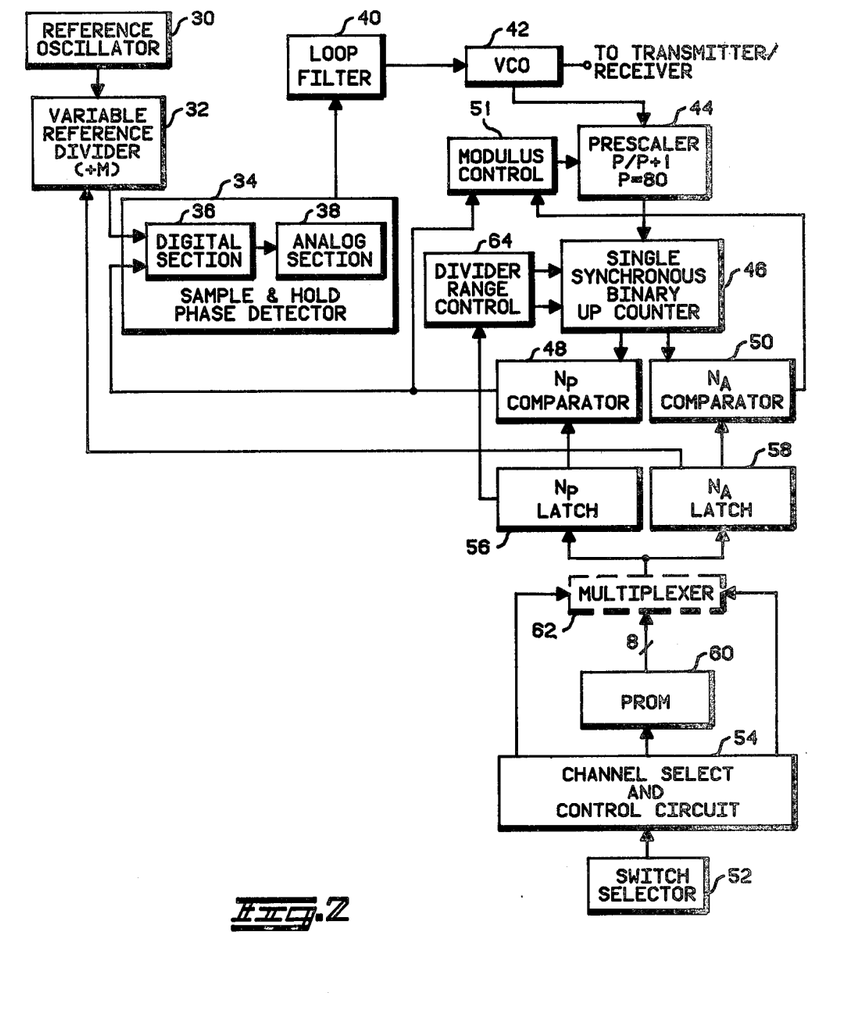
FIG. 2 is a functional block diagram of the digital frequency synthesizer system for the present invention.

FIG. 2 is a functional block diagram of the digital frequency synthesizer of the present invention. A reference oscillator 30 supplies an output signal to a variable reference divider 32 which is coupled to a sample and hold phase detector 34. Sample and hold phase detector 34 is shown to include a digital section 36 and an analog section 38. The output of phase detector 34 is supplied to a loop filter 40. Loop filter 40 is connected to a voltage controlled oscillator 42 which has a first output coupled to either a transmitter or a receiver and a second output coupled to a prescaler circuit 44. The output of prescaler circuit 44 is supplied to a synchronous binary up counter 46. Two signal outputs of counter 46 are applied to an $N_P$ comparator 48 and an $N_A$ comparator 50. An output of $N_P$ comparator 48 and an output of $N_A$ comparator 50 are coupled to a modulus control circuit 51. The output of modulus control circuit 51 is coupled to prescaler 44. The output of $N_P$ comparator 48 is also coupled to digital section 36 of phase detector 34.

A frequency switch selector 52 is coupled to a channel select and control circuit 54 which supplies signals to an $N_P$ latch circuit 56 and an $N_A$ latch circuit 58. An output address of channel select and control circuit 54 is also supplied to a programmable read-only memory PROM 60. The output of PROM 60 is coupled to a multiplexer 62 shown in phantom which in response to enable signals from channel select and control circuit 54 alternately supplies information to $N_P$ latch 56 and $N_A$ latch 58. Multiplexer 62 is not a physical device but rather represents the operation of transferring information from PROM 60 to the latches. $N_P$ latch 56 is coupled to a range divider control 64 which is coupled to synchronous binary counter 46. $N_P$ latch 56 is also coupled to $N_P$ comparator 48. An output from $N_A$ latch 58 is coupled to variable reference divider 32. $N_A$ latch 58 is also coupled to $N_A$ comparator 50.

In normal operation, switch selector 52 is actuated by the portable tranceiver operator to select a desired communication channel and supplies information to channel selected and control circuit 54 which in turn accesses PROM 60 to address a specific location which contains the $N_A$ and $N_P$ numerical divisors in their binary number configurations. The binary number configurations of the two divisors are supplied through multiplexer 62 and loaded into the appropriate $N_P$ latch 56 and $N_A$ latch 58. The purpose of the latches is to allow the information for subsequent comparisons to be available so that comparisons can be made at any time during the sampling operation even though power to the programmable read-only memory is terminated to reduce battery drain.

In a manner which is quite similar to the description for the digital frequency synthesizer shown in FIG. 1, reference oscillator 30 supplies a stable fixed frequency signal to variable reference divider 32. A portion of the binary configuration of the $N_A$ numerical divider as stored in $N_A$ latch 58 is supplied to variable reference divider 32 to establish the desired channel spacing for the portable transceiver. The sample and hold phase detector operates in both a digital and analog manner to provide a fast response and precise phase comparison for the loop operation. The output of phase detector 34 is supplied through a loop filter to the voltage controlled oscillator 42. The voltage controlled oscillator 42 is coupled in a normal manner alternatively to the transmitter or receiver to cause tuning of the transceiver and is also supplied to prescaler circuit 44. A portion of the binary configuration for numerical divisor $N_P$ as stored in $N_P$ latch 56 is utilized by divider range control circuit 64 and synchronous binary counter 46 to enable counting in the correct range for the desired tuning.

An output of $N_A$ comparator 50 is supplied to modulus control 51 and then to prescaler 44 to control the selection of the modulus for the prescaler operation. The prescaler begins its operation at one modulus and when the $N_A$ comparator indicates that a comparison has been reached, the modulus is then changed to another integer value. This change in cooperation with divider range control 64, allows the single synchronous binary counter 46 to correctly determine the frequency and supply appropriate signals to $N_A$ comparator 50 and $N_P$ comparator 48. While the operation of the $N_A$ comparator serves principally to change the prescaler modulus value at a crucial time, the operation of the $N_P$ comparator is fed back through the digital section 36 of the phase detector 34 and provides completion of the phase lock loop circuit. As will be described in more detail later, the combination of the $N_A$ and $N_P$ comparators along with the divider range control and the selectable prescaler allow the operation of a single synchronous counter to provide all of the division ratios necessary in the phase locked loop to achieve correct tuning.

Normally, the synchrohous binary counting would be done with two separate binary down counters, and the predetermined numbers would be loaded into each to determine when change of the modulus of the prescaler should occur so that the digital analysis of the incoming signal could be completed to determine frequency correspondence within the phase locked loop circuit. However, in one aspect of the present invention the system is designed to operate with a single synchronous binary counter to achieve all of the necessary counting and dividing functions for precise synthesis of the desired frequencies.

The phase locked loop circuit of the present invention compares a divided down reference frequency from stable reference oscillator 30 to a sub-multiple of the voltage controlled oscillator frequency and makes corrections to VCO 42 in order to force the frequencies to be equal. The variable reference divider ratio is derived from information contained in the binary equivalent of the $N_A$ numerical divisor as loaded in $N_A$ latch 58. The function of prescaler 44, synchronous counter 46, range divider control 64 and comparators 48 and 50 are to provide a "divide by a variable number" function which may be called $N_T$. For tuning, the M divider ratio is programmed to correspond to the appropriate reference frequency, and $N_T$ is varied in order to move the voltage controlled output frequency in increments equal to the reference frequency. The reference value may be determined by considering both the minimum channel spacing and the transceiver multiplier.

The tuning is achieved by programming the appropriate reference frequency through a chain of dividers which may be summed up as dividing by an integer M. Once the reference frequency is established, the phase detector circuit compares the reference frequency to a submultiple of the VCO frequency. Sample and hold phase detector 34 operates much like a standard phase detector when the reference and VCO submultiple signals are not at the same frequency. However, a distinguishing phase mode of operation is established when the reference and the VCO submultiple signals are at the same frequency and the reference signal is leading in phase. Digitally this corresponds to a condition in which the variable VCO pulse is interleaved in one period of the reference pulse. A voltage proportioned to the phase difference between these signals is applied to loop filter 40 to steer VCO 42 and thus correct for any variations in the VCO frequency. For the dual modulus prescaler, the VCO output frequency is divided down by first P plus one and then P. For every P plus one pulse entering the programmable counter, both the $N_A$ count and the $N_P$ count are incremented by one. The dual modulus prescaler divides by P plus one until the count reaches the $N_A$ program state, then the modulus of prescaler 44 is changed to P. The prescaler divides by P a total of $N_P-N_A$ pulses until the $N_P$ program stage is achieved. Once the $N_P$ count is detected, the system resets and the cycle repeats by operating through modulus control 51.

To understand the operation of the frequency synthesizer and its dividing relationship for various frequencies, it is convenient to consider an example so that the various elements of the system may be understood completely at the outset. The preferred embodiment for the present invention includes the digital frequency synthesizer modifying a standard transceiver. An example of such a standard transceiver is one manufactured by Motorola and designated as MX300. There are several models of the MX300 which may be characterized by their range of operating frequencies. For example, there are VHF, UHF and 800 MHZ models which can operate only within each designated frequency range. A feature of the Motorola MX300 VHF system which must be described is that in receive mode the receiver portion of the circuit includes a frequency doubler, that is, the frequency from the voltage controlled oscillator is doubled prior to injection. In addition, for the transmit mode, the phase locked loop itself includes a multiplication factor of three so that the VCO frequency is tripled before injection. The operation of the phase locked loop transmitter system of the preferred embodiment is described in U.S. Pat. No. 3,958,186 to Jesse et al., and assigned to the assignee of the present invention which is hereby incorporated by reference. Thus, the transceiver system embodiment has different multiplication factors for both transmit and receive modes.

It is most convenient to consider the operation in the receive mode. For simplicity, the VHF band is selected and encompasses frequencies in the range of 136–174 MHz. A common spacing specified by the FCC or equivalent foreign communication agencies would be a multiple of either 5 kHz or 6.25 kHz for the various communication channels. Choosing the 5 kHz spacing, any frequency channel which satisfies the relationship 136 MHZ+ some multiple times 5 kHz may be tuned. The spacing corresponds to an output frequency of variable reference divider 32 of 2.5 kHz.

It has been found convenient to use a standard 3.6 MHz crystal for reference oscillator 30 and to produce the 5 kHz spacing, variable reference divider 32 must divide down by a ratio equal 1,440. The simple calculation will confirm that 3.6 MHz divided by 1,440 equals 2.5 kHz and when one includes the doubling factor present in the MX300 series receiver this corresponds to the specified 5 kHz smallest increment of frequency change. Therefore, the divide by M operation of variable reference divider 32 would correspond to division by 1,440. As will be recalled, for the description of FIG. 1, the M divider ratio is normally fixed and generally the second divider ratio which in the case for the present embodiment will be referred to as $N_T$ is varied in order to move the voltage controlled oscillator output frequency in 5 kHz increments. In the present invention the divide by M ratio is fully programmable.

The reference incremental frequency is determined by selecting minimum channel spacing and the output multiplier for the frequency to be synthesized. Knowing this divided down reference frequency, one can determine what the range of the total variable division must be for the end points of the total tuning frequency range. Thus, if one takes the low end point of the VHF region 136 MHz subtracting off the IF which, will be considered to be 21.4 MHz and dividing by the multiplier 2 the resulting voltage controlled oscillator frequency is 57.3 MHz. Similarly the high end point is 76.3 MHz.

To understand the total numerical division ratio necessary to achieve these end point frequencies, one takes the end point VCO frequencies and divides by 2.5 kHz which is the smallest incremental change that is provided by variable reference divider 32 and determines that the total numerical range of $N_T$ corresponding to the designated VHF range is from 22,920–30,520. Thus, if the voltage controlled oscillator frequency is divided by either of these two numbers and phase compared to the reference the receiver will be tuned to the end points of the VHF tuning region.

It is necessary to compute the $N_P$ and $N_A$ values so that they might be understood in conjunction with the total numerical divisor operating on the voltage controlled oscillator frequency in the phase locked loop. Because dual modulus counting is used, the equation which relates the $N_P$'s and $N_A$'s to the total $N_T$ as calculated is the following: $N_T = (N_P - N_A) \times P + N_A \times (P+1)$ where P is the value of the modulus of prescaler 44. This relationship using a dual modulus prescaler which in the case of the VHF region chosen operates at a division of either 81 or 80 for the prescaler operation, provides the counting relationship so that with a suitable combination of $N_P$'s and $N_A$'s the total division may be achieved to tune the voltage controlled oscillator to the appropriate frequency. While the mechanics of the precise operation of division to determine the integer and decimal equivalents of dual modulus counting need not be detailed here, it will be obvious to those skilled in the art that the total $N_T$ of 22,920 corresponds to an $N_P$ of 286 and an $N_A$ of 40, while the larger total numerical divisor $N_T$ of 30,520 corresponds to an $N_P$ of 381 and an $N_A$ of 40. The $N_P$ number may also contain in the most significant bit, information to specify the range of operation for the synthesize tuning to divider ranger control 64. The $2^7$ position of $N_P$ at 0 will indicate to the divider range control that the $N_P$ will lie in the range of 256–383, that is well within the required 286–381 range for tuning the required VHF frequencies. Thus, the binary configuration of $N_P$ need only contain the difference between the range low end point and the calculated $N_P$. The binary configurations of the required $N_P$'s and $N_A$'s with the most significant bit (MSB) on the left are:

| 256 to 383 | $2^7$ | $2^6$ | $2^5$ | $2^4$ | $2^3$ | $2^2$ | $2^1$ | $2^0$ | |
|---|---|---|---|---|---|---|---|---|---|
| 286 − 256 = 30 $N_P$: | 0 | 0 | 0 | 1 | 1 | 1 | 1 | 0 | $(30)_2$ |
| $N_A$: | 0 | 0 | 1 | 0 | 1 | 0 | 0 | 0 | $(40)_2$; |
| 381 − 256 = 125 $N_P$ | 0 | 1 | 1 | 1 | 1 | 1 | 0 | 1 | $(125)_2$ |
| $N_A$: | 0 | 0 | 1 | 0 | 1 | 0 | 0 | 0 | $(40)_2$ |

Similarly, the highest order bit in the $N_A$ binary representation may be used to designate to the variable divider 32 a change in the value of M that may be required for the operation of different channel spacings. This is why a control line is shown in FIG. 2 connecting $N_A$ latch 58 and variable reference divider 32. However, in the case of the receive and transmit frequencies at the 5 kHz spacing it is the actuation of the push-to-talk (PTT) switch which resets the value of the M numerical to modify the reference frequency. It should be recalled that for the operation of a Motorola MX300 VHF transceiver which utilizes a multiplication factor of 3 in the transmit mode but a factor of two in the receive mode, the reference frequency of the synthesizer must be different in the two modes.

If, however, the system in which the device were to operate had different spacings for transmit and receive, then the highest order $N_A$ bit would be coded appropriately to indicate this and thereby change the divider ratio so that the correct tuning would be achieved. Similar examples could be worked out for both the UHF and 800 MHz bands for which there is a market demand. The modifications for such examples would include those directly attributable to the receiver embodiment as well as the customary transmission and reception frequencies for those bands.

Figure 3:
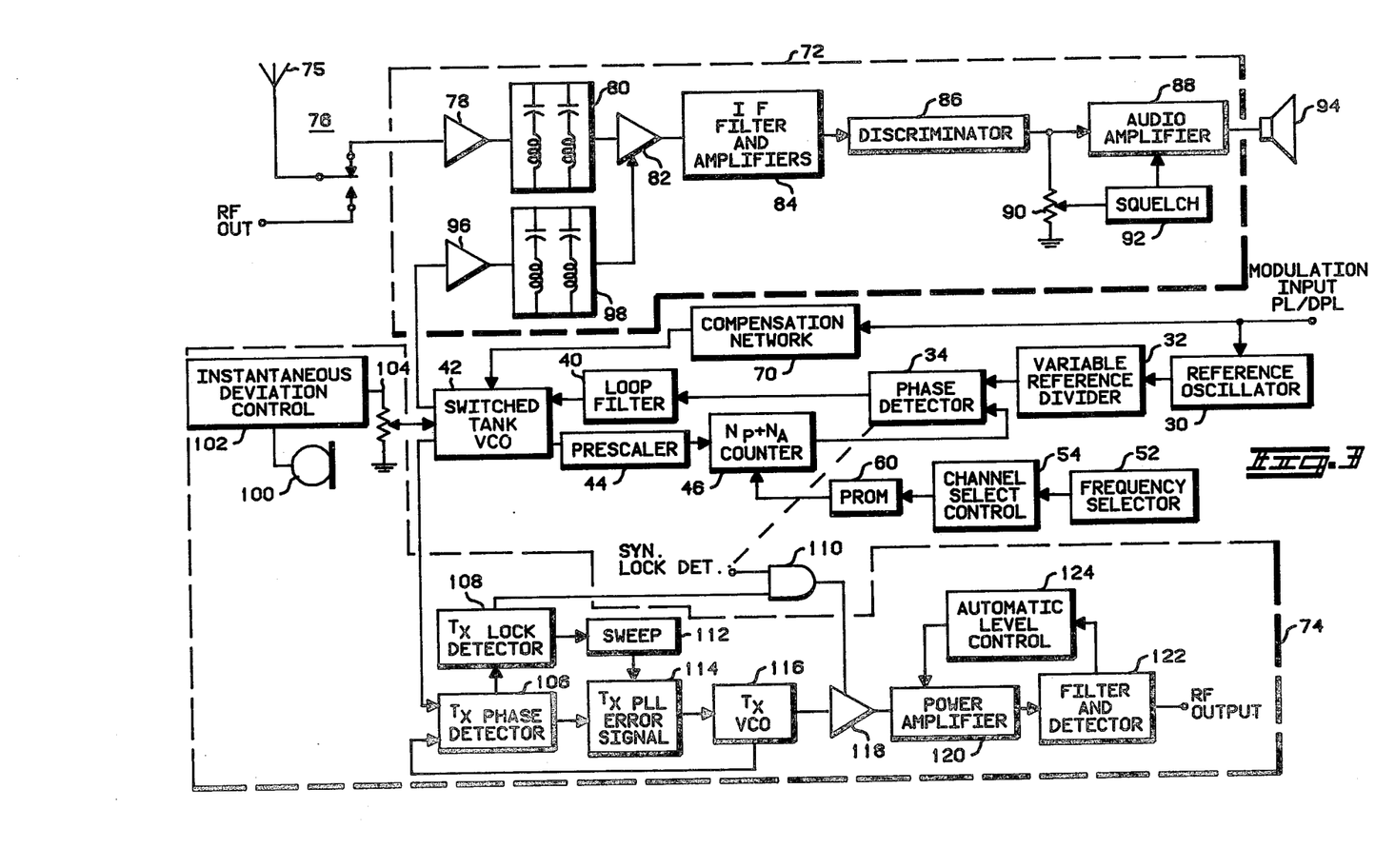
FIG. 3 is a functional block diagram of a VHF transceiver employing the present digital frequency synthesizer invention.

FIG. 3 is a functional block diagram of a complete VHF transceiver employing the present disclosed digital frequency synthesizer. Consistent with the description in FIG. 2, frequency selector 52 is coupled to channel select control 54 which is coupled to PROM 60 which supplies programmed information to $N_P$ and $N_A$ counter 46. The digital synthesizer employs reference oscillator 30 coupled through variable frequency divider 32 to phase detector 34 which also receives an input from counter 46. The output of phase detector 34 is coupled to loop filter 40 which is also coupled to VCO 42. VCO 42 is further described as a switched tank VCO. VCO 42 is connected through prescaler 44 to $N_P$ and $N_A$ counter 46. An input signal designated modulation input is applied to reference oscillator 30 and through a compensation network 70 to VCO 42. This collection of functional blocks represents the frequency synthesizer system more completely described in FIG. 2.

To understand the operation of the transceiver it is necessary to distinguish the separate receiver and transmitter sections functions with respect to the digital frequency synthesizer. FIG. 3 is segregated into two distinct circuit sections, each of which is enclosed by a broken line. In particular, the receiver section is designated 72 while the transmitter section is designated 74.

An antenna 75 is coupled through antenna switch 76 to an RF amplifier and filter 78 in receiver section 72. The output of amplifier 78 is coupled to a four pole filter 80 which is coupled to mixer 82. The output of mixer 82 is coupled to IF filter and amplifier 84 whose output is coupled to discriminator 86. The output of discriminator 86 is directly coupled to audio amplifier 88 and through potentiometer 90 to ground. A squelch control circuit 92 is connected to a variable tap of potentiometer 90 and to audio amplifier 88. The output of audio amplifier 88 is connected to a speaker 94. An output of VCO 42 from the frequency synthesizer section is coupled through a times two multiplier 96 and a three pole filter 98 to mixer 82.

For transmitter section 74, a microphone 100 is coupled through an instantaneous deviation control circuit 102 to a potentiometer 104. The variable tap of potentiometer 104 is coupled to switched tank VCO 42. The second output of VCO 42 is coupled to a transmitter phase detector 106 to provide a synthesized reference frequency source for the transmitter phase locked loop. The output of transmitter phase detector 106 is coupled to a transmitter lock detector 108 which has a first output coupled to PLL interface gate 110 and a second output coupled to sweep control 112. The output of sweep control 112 is coupled to error signal circuit 114, which also receives an input directly from phase detector 106. The output of error signal circuit 114 is coupled to a transmitter VCO 116 which has a first output coupled back to phase detector 106. A second output of transmitter VCO 116 is coupled to RF gate 118. A signal from synthesizer phase detector 34 is applied to a second input of PLL interface gate 110.

The output of gate 110 is applied to a control input of RF gate 118. The output of RF gate 118 is coupled to a power amplifier 120 whose output is coupled to a filter and detector 122. The output of filter and detector 122 is coupled back through an automatic level control 124 to a control input of power amplifier 120. A second output of filter and detector 122 is designated RF output which is connected to the second terminal of antenna switch 76.

In operation, for the receiver section, antenna 75 provides a signal to RF amplifier 78 which both amplifies and filters it and supplies the amplified and filtered signal through four pole filters 80 to mixer 82. The output of the digital synthesizer controlled VCO 42 is coupled through a times two multiplier 96 and through a three pole filter 98 to mixer 82. In a standard method, the two signals are combined in the mixer using a superheterodyning technique to produce an intermediate frequency signal which is supplied through IF filter and amplifier 84 to a discriminator which detects carrier encoded information. The detected information is supplied to audio amplifier 88. In a manner consistent with normal operation squelch control 92, which has an adjustable threshold level is coupled to the audio amplifier. At the output of the audio amplifier is a standard speaker through which the decoded information is converted to an acoustical signal so that the transceiver operator may receive communications.

In a similar manner to prior radios, microphone 100 operates through the instantaneous deviation control 102 which is adjustable through potentiometer 104 to supply a signal which modulates voltage controlled oscillator 42 the output of which is supplied to transmitter circuitry 74. The modulated information is supplied to transmitter phase detector 106 which supplies information both to transmitter error signal detector 114 and transmitter lock detector 108. Lock detector 108 controls sweep control 112 which supplies its output to transmitter error signal 114. The output of transmitter error signal 114 is coupled to transmitter VCO 116 which also supplies a signal back to transmitter phase detector 106. The transmitter section operates to modulate the synthesizer VCO 42 through microphone 100 and IDC 102 and the resulting signal is supplied to the transmitter phase locked loop.

Transmitter PLL interface gate 110 ensures that no transmission can occur unless the frequency synthesizer is locked onto a fixed correct frequency. Thus, the phase lock loop interface circuit is disabled during the frequency selection operation of the digital frequency synthesizer but this gate is enabled when that frequency is locked.

In a normal manner, the RF gate 118 supplies the RF modulated information to power amplifier 120 and then to a filter and detector network which includes automatic level control 124. The output of the RF filter and detector circuit 122 is supplied to antenna switch 76 which, during transmit operation, would be disconnected from receiver circuitry 72 and connected directly to transmitter circuitry 74. The voice signal information would then be transmitted through antenna 75 in a normal manner.

FIG. 3 has shown the interconnection of the digital frequency synthesizer system of the present invention connected to known receiver and transmitter circuitry thus providing the complete transceiver embodiment for the present invention. Prior art methods show combining phase locked loops through frequency mixers to obtain final tuning frequencies. This is done to provide course and fine tuning but can cause many subsequent filtering problems due to the production of spurious signals. These problems are eliminated for the preferred embodiment. The output of the digital frequency synthesizer of the present invention is coupled to provide a reference frequency source for the transmitter phase locked loop. Thus no spurious signals due to mixing are produced.

Figure 4:
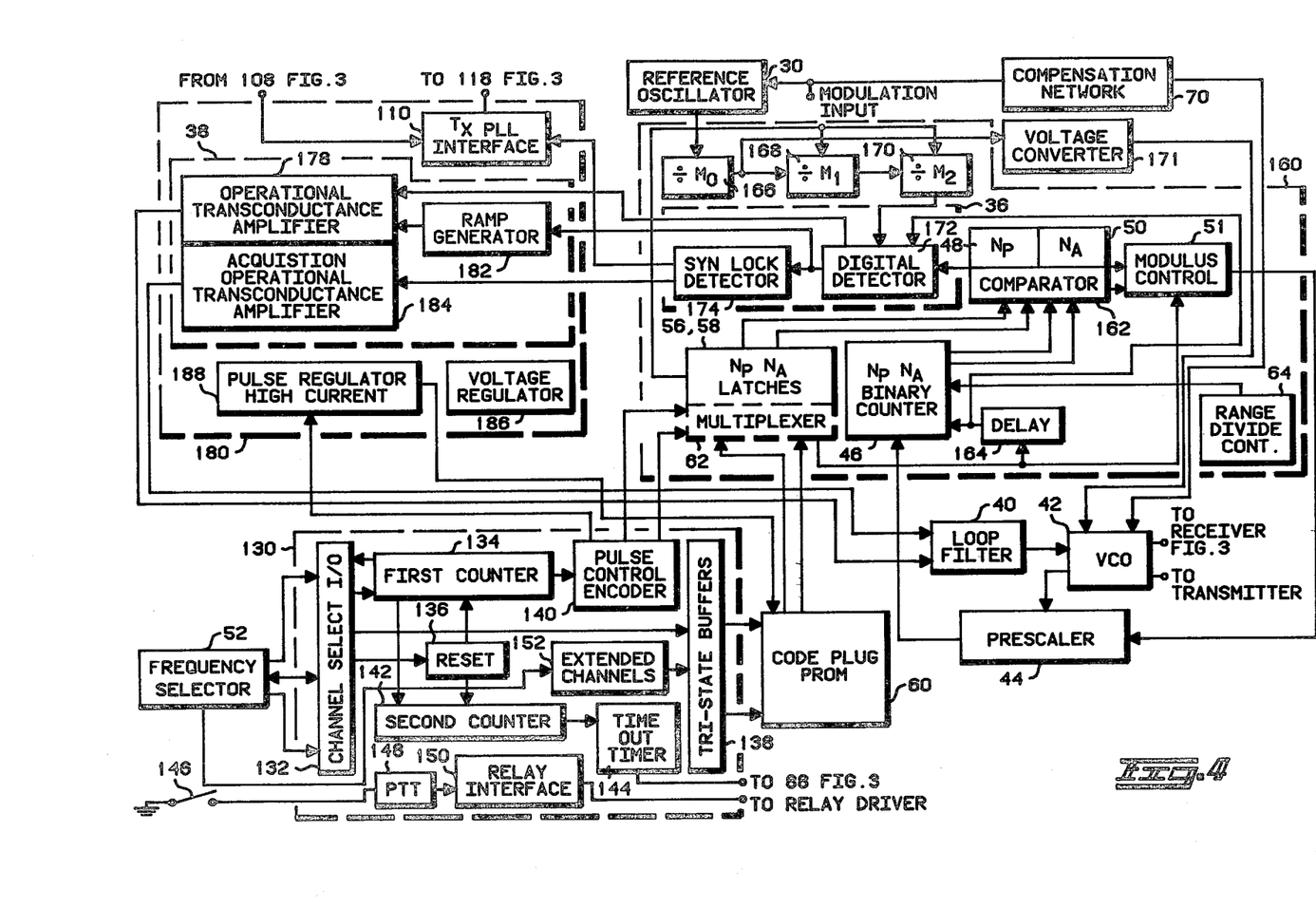
FIG. 4 is a detailed functional block diagram of the frequency synthesizer system of the present invention including the subdivision of the several functions onto several integrated circuits.

FIG. 4 shows a more detailed functional block diagram of the digital frequency synthesizer of the present invention emphasizing the arrangement of the various functional blocks onto several distinct integrated circuits which are shown enclosed by broken lines. In particular, frequency selector 52 is shown interconnected with an integrated circuit 130 which includes several interconnected functional blocks. A channel select input/output circuit 132 is interconnected with a first counter 134. Channel select I/O 132 also interconnects a reset circuit 136 and tristate buffers 138. An output of first counter 134 is coupled to a pulse control encoder 140. First counter 134 and reset 136 are each coupled to a second counter 142. The output of second counter 142 is coupled to a time-out timer 144 which has an output coupled to audio amplifier 88 in FIG. 3. A push-to-talk switch 146 is coupled to push-to-talk circuitry 148 which is coupled to a relay interface 150. The output of relay interface 150 is coupled to a relay driver circuit, which causes the actuation of antenna switch 76 as shown in FIG. 3. Also shown within integrated circuit 130 is an extended channels module 152 coupled to frequency selector 52 and tristate buffers 138. The outputs of tristate buffers 138 are directly connected to code plug PROM 60.

The inclusion of the several elements into integrated circuit 130 may be seen from the functional description to be closely related by their function within the operation of the digital frequency synthesizer. It is not imperative that they be located on the same integrated circuit, however, it has been found convenient to combine them appropriately.

The output of code plug PROM 60 is coupled to multiplexer 62 which is contained within a second integrated circuit 160 shown enclosed by a broken line. Multiplexer 62 is coupled to $N_P$ and $N_A$ latches 56 and 58 whose outputs are appropriately coupled to $N_P$ and $N_A$ comparators 48 and 50, respectively. Pulse control encoder 140 in IC 130 is coupled to multiplexer 62, and through multiplexer 62 to a delay circuit 164 contained within IC 160. Outputs from $N_P$ comparator 48 and $N_A$ comparator 50 are coupled to modulus control 51. An output from modulus control 51 is coupled back to prescaler 44. Integrated circuit 160 contains the digital frequency dividing and counting section of the digital frequency synthesizer and shows a more detailed description of the arrangement of the various components of the digital frequency synthesizer. As is the case for FIG. 2, the $N_P$ and $N_A$ binary counter 46 is coupled directly to $N_P$ and $N_A$ comparators 48 and 50 respectively. Delay circuit 164 is coupled to the $N_P$ and $N_A$ binary counter 46. This is the same single synchronous binary up counter as shown in FIG. 2.

Reference oscillator 30 is coupled to a sequence of three serially connected dividing circuits designated $M_0$, $M_1$ and $M_2$ which carry the corresponding referenced numerals 166, 168 and 170. An output of divider 166 is also coupled through a voltage converter 171 to VCO 42. The output of divider 170 is coupled to a digital detector 172 which is coupled to a synthesizer lock detector 174. Digital detector 172 and synthesizer lock detector 174 are shown enclosed by a broken line designated as 36 which corresponds to the digital section of the sample and hold phase detector 34 as shown in FIG. 2.

An output of $N_P$ comparator 48 is coupled to digital detector 172. An output from delay circuit 164 is coupled back to a second input of digital detector 172. Range divider control 64 is coupled to $N_A$ and $N_P$ divider 46. An output from $N_A$ latch 58 is coupled to dividers 168 and 170. Dividers 166, 168 and 170 function to serially divide the output signal from reference oscillator 30 to provide a programmed reference frequency to digital detector 172. An input signal designated modulation input is supplied to reference oscillator 30 and through compensation network 70 to VCO 42. This is the same signal path as in FIG. 3.

An output of digital detector 172 is connected to an operational transconductance amplifier 178 which is contained within a third integrated circuit 180 shown enclosed by a broken line. A second output from digital detector 172 is coupled to a ramp generator 182 also contained in integrated circuit 180. An output from synthesizer lock detector 174 is coupled to an acquisition operational transconductance amplifier 184 also contained within integrated circuit 180. A second output of synthesizer lock detector 174 is directly coupled to TX PLL interface 110. The TX PLL interface 110 also has an input signal from the transmitter lock detect circuit of FIG. 3 and provides an output to the transmitter RF gate 118 as shown in FIG. 3.

The combination of operational transconductance amplifier 178, acquisition OTA 184 and ramp generator 182 are shown additionally enclosed by a broken line designated 38 which corresponds to the analog section of the sample and hold phase detector 34. In addition, IC circuit 180 contains a voltage regulator circuit 186 which supplies regulated voltage to the several IC's and its many interconnections have been omitted to reduce the complexity. IC 180 further contains a pulse regulator high current circuit 188 which supplies power to PROM 60. Pulse regulator 188 also receives a signal from pulse control encoder 140 contained within integrated circuit 130.

The outputs of OTA 178 and acquisition OTA 184 are applied to loop filter 40. Loop filter 40, is coupled directly to VCO 42 which in turn provides output signals to the receiver and transmitter sections as shown in FIG. 3 and has an additional output supplied to prescaler 44. An output of prescaler 44 is coupled to the combination $N_P$ and $N_A$ counter 46 within integrated circuit 160.

The basic operation of the block diagram shown in FIG. 4 is the same as in FIG. 2. However, within each of the integrated circuits, additional detail is included for the function of the control and signal path within the several integrated circuits. FIG. 4 is intended rather than a detailed description of the individual functions of the various integrated circuits to show the arrangement of the several functions constituting the digital frequency synthesizer into several integrated circuits, which are grouped by function. Thus, the digital counting and digital section of the sample and hold phase detector are all located on integrated circuit 160. The analog section of sample and hold phase detector 34 is located on integrated circuit 180 which further contains other analog circuitry to provide other analog functions. Thus, the segregation of the various submodules of the block diagram of FIG. 2 are implemented using different technologies combined with the grouping of similar functions within the digital frequency synthesizer system to optimize the design.

Similarly, the integrated circuit 130 contains all of the channel selection and debounce circuitry along with all of the operational control features of the digital frequency synthesizer system. It is convenient to include all of these on a single integrated circuit so that the various control monitoring functions can be grouped together for ease of manufacture and subsequent macroscopic analysis. Integrated circuit 130 is the detailed circuit implementation of channel select control 54 as shown in FIG. 3. The other modules shown in FIG. 4 are precisely the same functional blocks as shown in FIG. 2.

Figure 5:
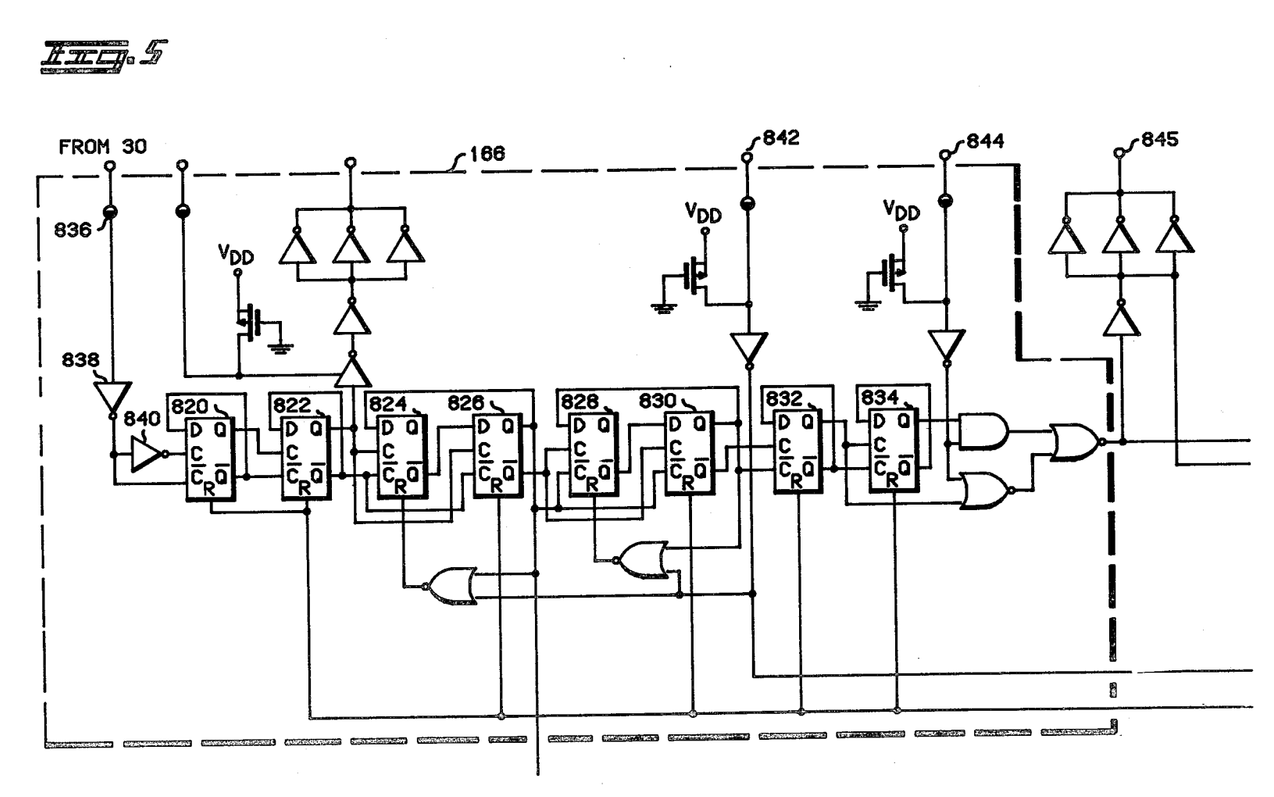
FIG. 5 shows a detailed electrical schematic for the frequency divisional circuitry of the frequency synthesizer.

Referring now to FIG. 5, divider 166 which is shown as divider $M_0$ in FIG. 4 consists of a series of data flip-flops suitably interconnected to provide binary division. In particular, the eight data flip-flops which comprise $M_0$ divider 166 are designated 820, 822, 824, 826, 828, 830, 832 and 834. An output from reference oscillator 30 is coupled through a protection circuit 836 to inverter 838. The output of inverter 838 is applied to the $\overline{\text{clock}}$ terminal of flip-flop 820. The output of inverter 838 is also connected through an inverter 840 to the clock terminal of flip-flop 820. Sufficient logic connections are shown in $M_0$ divider circuit 166 to provide variable division of the input reference frequency. In particular, the combinations of flip-flops 820 and 822 provide a divide by four operation. The combination of flip-flops 824, 826, 828 and 830 can provide a divide by nine or 16 operation depending upon the logic level at input terminal 842. Flip-flops 832 and 834 provide either a divide by two or divide by four operation depending upon the logic level of input terminal 844.

The output of $M_0$ divider 166 is supplied at output pad 845 as the 50 kHz time base signal. It will be appreciated by those skilled in the art that the time base for the operation of the debounce circuit and automatic turn-off gates is dependent upon the selection of the choice of possible divider ratios in $M_0$ divider 166.

However, the actual frequency of the time base may vary as long as the corresponding timing of the circuit is dependent upon a divided down frequency signal from the reference oscillator. In addition by operating through $M_O$ divider 166, reference oscillator 30 provides a very stable time base signal at terminal 845 as shown in FIG. 5 which is supplied to IC 130.

Figure 6:
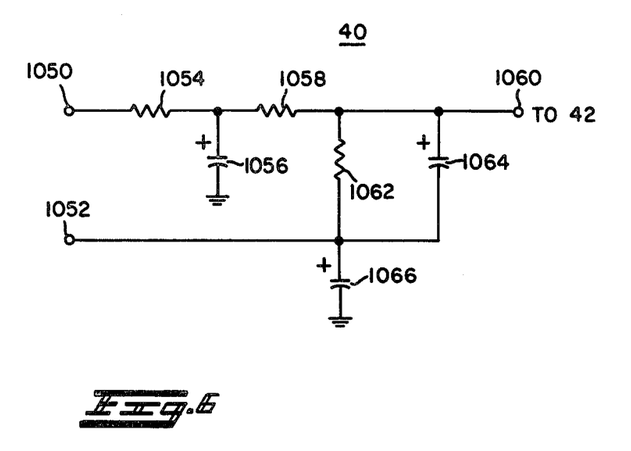
FIG. 6 is an electrical schematic of the loop filter circuit for the frequency synthesizer of the present invention.

FIG. 6 shows the detailed electrical schematic for loop filter 40 as shown in FIGS. 2 and 4. The output terminal carrying the signal from OTA 178 and designated 1050 is coupled through a resistor 1054 in series with a capacitor 1056 to ground. Resistor 1054 is also connected through a resistor 1058 to the output terminal 1060 of loop filter 40. Resistor 1058 is also connected through a resistor 1062 to input terminal 1052 which corresponds to the output terminal of acquisition OTA 184. Output terminal 1060 is also connected through a capacitor 1064 in parallel to resistor 1062 to input terminal 1052. Terminal 1052 is also connected through a capacitor 1066 to ground.

Loop filter 40 is a low pass filter whose function is to provide relative stability for the loop and filtering between the output of the sample and hold digital and analog phase detector and voltage controlled oscillator 42. A principal function is to prevent reference frequency signals and harmonics coming from any of the variable frequency dividers 166, 168 or 170 from passing through and adversely affecting the control of voltage controlled oscillator 42. A secondary feature of loop filter 40 is to provide a filtering operation to prevent the passage of spurious and low frequency signals from reaching the voltage controlled oscillator to achieve good FM hum and noise performance.

Because of the presence in the preferred embodiment of different multipliers for the injection frequency in both the receive and transmit sections of the transceiver, it is necessary that we use a low reference frequency for comparison. Because of the presence of possible spurious signals related to the reference signal frequency and the fact that there would ordinarily be no protection in the audio circuits against them, the loop filter of necessity requires a very narrow bandwidth to insure that these frequencies will not pass to either disrupt the operation of the VCO or other parameters of the system. The combination of resistor 1054 and capacitor 1056 provides the additional attenuation required to prevent the passage of spurious frequencies derived from the reference frequency into the voltage controlled oscillator. The remaining four components, resistors 1058, 1062 and capacitors 1064 and 1066 constitute a low-pass filter which provide the proper stability for the operation of the phase locked loop.

It should be observed that input/output terminal 1050 which predominantly carries the output signal from OTA 178 is applied through both filter sections while the output of acquisition OTA 184 is applied at terminal 1052 which bypasses most of the resistive elements and operates through resistor 1062 which connects with output terminal 1060 to provide the unattenuated signal to VCO 42. This means that the output of acquisition OTA 184 can be supplied to the voltage controlled oscillator 42 to cause rapid advancement to have the frequency of the voltage controlled oscillator correspond to that of the reference frequency.

Figure 7:
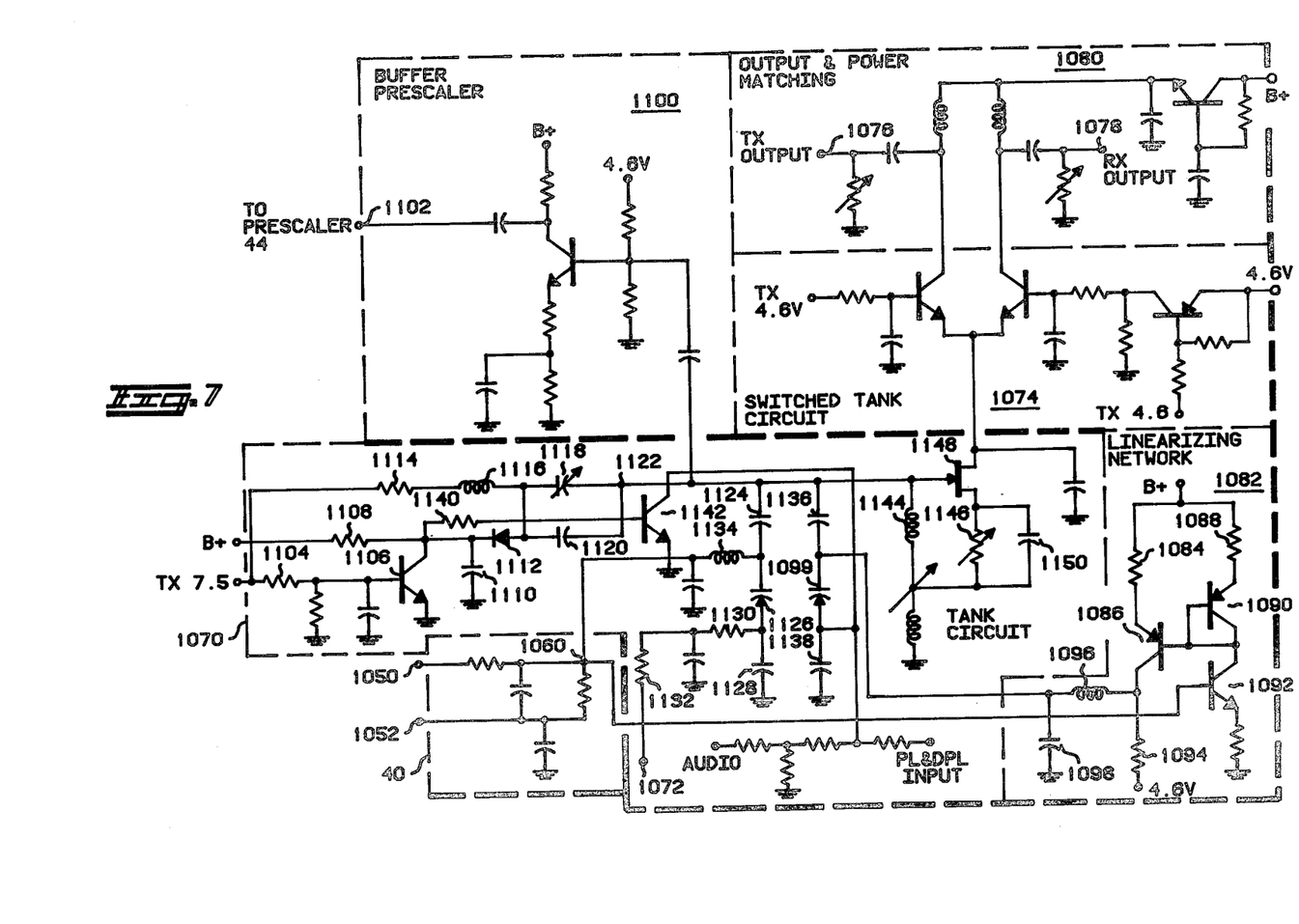
FIG. 7 is an electrical schematic of a VHF voltage controlled oscillator for the frequency synthesizer of the present invention.

FIG. 7 shows the detailed electrical schematic for a VHF voltage controlled oscillator for the frequency synthesizer system. While voltage controlled oscillators are known and used in the prior art, this design includes certain features which will be described in detail. Voltage controlled oscillator 42 has been designed for low sideband noise to provide high spectral purity for the digital frequency synthesizer. The various segments of the circuit are enclosed by broken lines.

Loop filter 40 is shown having output terminal 1060 coupled to a resonating tank circuit which is labelled 1070. Tank circuit 1070 oscillates at a frequency determined by the DC level at the output of loop filter 40 in conjunction with the voltage supplied through terminal 1072 which is derived from voltage converter 171. The tank circuit includes varactor diodes coupled with suitable circuitry to provide the appropriate resonance to achieve tuning. As is shown, a 7.5 volt source which is actuated during the transmit mode is applied along with the B+ battery voltage which is typically 7.5 v. Also shown coupled to tank circuit 1070 is a PL and DPL input and an audio input. The audio input and PL and DPL inputs were discussed earlier in the description of the modulation input for FIG. 4. Such private line and digital private line along with voice security or audio function are well known in the art and exist on the present Motorola MX 300 series radios.

The preferred embodiment uses a two port modulation technique in which the first port is at the reference oscillator 30 and the second is at VCO 42. The modulation compensation network 70 compensates for the different gains at reference oscillator 30 and VCO 42. The two port modulation technique provides a flat modulation response. The compensation network has been found to be advantageous for the modulation of digital signals since the phase locked loop acts as a high pass filter when voltage controlled oscillator 42 is modulated and it acts as a low pass filter when modulating the loop at the reference oscillator port. This modulation scheme provides a flat frequency response avoiding distortion of the low frequency signals. It should be observed that for receive the transmit 7.5 volt line is inactive and that the tank circuit 1070 is determined to be appropriate for the receive operation. However, when the transmitter is actuated, the 7.5 volt source applies a signal through the TX 7.5 volt input terminals to alter the resonant frequency of the tank circuit.

The output of the tank circuit is supplied to switched tank circuit 1074. For the transmit mode switched tank circuit 1074 operates in conjunction with the activation of the transmit 7.5 volt source to cause the signal output from tank circuit 1070 to be applied to the transmitter output terminal designated 1076. Similarly, during receive mode, switched tank circuit 1074 operates to supply the output to receiver output terminal 1078. Both switched output terminals 1076 and 1078 are shown enclosed in a block designated 1080 and labelled output and power matching circuit.

Switched tank circuit 1074 is a cascode arrangement which allows direction of the injection signal along either separate path depending on either the receiver or the transmit mode of operation. Both the transmitter and receiver outputs are variable through a variable resistor to match desired output signal levels. In the Motorola MX300 series, transceivers for the UHF and 800 MHz bands do not have the different multiplication stages in the transmitter and receiver sections. Therefore, switched tank circuit 1074 would not be necessary.

Linearizing network 1082 is shown enclosed by a broken line. For audio transmissions, it is necessary to keep a constant modulation deviation for the audio signal over the entire tuning band. The function of linearizing network 1082 is to provide a linear correction so that regardless of the frequency at which the transmitter section is operated, as controlled by the main varactor diode, the modulation deviation remains constant. This linearizing network in combination with the modulation varactor diode and the main varactor diode adds a feature to the voltage controlled oscillator that is unique.

B+ is applied through a resistor 1084 to the emitter of a PNP transistor 1086. B+ is also applied through a resistor 1088 to the emitter of a PNP transistor 1090. The collector of transistor 1090 is coupled to its base and to the base of transistor 1086. The collector of transistor 1090 is also connected to the collector of a transistor 1092. The base of transistor 1092 is connected into loop filter 40 at junction 1060 to monitor the control voltage. The collector of transistor 1086 is connected through resistor 1094 to a regulated source of 4.6 volts. The collector of transistor 1086 is also connected through an inductor 1096 to a capacitor 1098 connected to ground. The interconnection of capacitor 1098 and inductor 1096 are connected to the cathode of the modulation varactor diode 1099. Varactor diode 1099 has a tuning sensitivity on the order of 1/1000th the sensitivity of the main varactor diode.

Also shown connected to tank circuit 1070 is prescaler buffer 1100. This prevents any spurious signals from prescaler 44 from entering tank circuit 1070 and disrupting the information contained therein. The output terminal is designated 1102.

Concentrating on tank circuit 1070, many of the tuning circuits for voltage controlled oscillators are known in the prior art. However, the interconnections for tank circuit 1070 are designed to cooperate with the various features in a frequency synthesized radio of the preferred embodiment. The transmitter 7.5 voltage source is applied through a resistor 1104 to the base of an NPN transistor 1106. The base of transistor 1106 is connected through a parallel combination of a resistor and capacitor to ground. The emitter of transistor 1106 is also connected to ground. B+ voltage, (battery voltage), is applied through a resistor 1108 to the collector of transistor 1106 which is also connected through a capacitor 1110 to ground and to the cathode of a pin diode 1112. The transmitter 7.5 voltage source is also applied through a resistor 1114 and an inductor 1116 to the anode of pin diode 1112. Also coupled to the anode of pin diode 1112, are a parallel combination of a variable capacitor 1118 and a fixed capacitor 1120 whose second common point is a junction 1122. Junction 1122 is coupled through a capacitive network to prescaler buffer 1100.

Junction 1122 is also connected through a capacitor 1124 to the cathode of a main varactor diode 1126. The anode of diode 1126 is coupled through a capacitor 1128 to ground and through a resistor 1130 in series with a resistor 1132 to terminal 1072 at which is applied the voltage from voltage converter 171. The junction between resistors 1130 and 1132 is also coupled through a bypass capacitor to ground. The cathode of varactor diode 1126 is coupled through an inductor 1134 to junction 1060 in loop filter 40. Junction 1060 is also coupled through a bypass capacitor to ground.

Junction 1122 is also coupled through a capacitor 1136 to the cathode of modulation varactor diode 1099. The anode of diode 1099 is also coupled through a capacitor 1138 to ground. The collector of transistor 1106 is coupled through a resistor 1140 to the base of NPN transistor 1142. The emitter of transistor 1142 is coupled to ground and the collector is coupled to the anode of varactor diode 1099 and through a resistor to the PL and DPL modulation input circuit. The audio modulation input terminal is also coupled through a voltage dividing network to the anode of varactor diode 1099. The cathode of varactor diode 1099 is coupled to inductor 1096 in linearizing network 1082.

The junction 1122 is also coupled to a variable inductor 1144 shown in two portions. The variable wiper portion of inductor 1144 is coupled through a variable resistor 1146 to the source electrode of an N channel JFET 1148. Capacitor 1150 is in parallel with variable resistor 1146. Junction 1122 is also connected to the gate electrode of JFET 1148. The drain electrode of JFET 1148 is coupled through a bypass capacitor to ground and is coupled to switched tank circuit 1074 to provide the path for the output signals from tank circuit 1070 so that they may be then directed towards either the receiver section or the transmitter section of the transceiver.

In the receive mode, the parallel arrangement of capacitors 1118 and 1120 are effectively out of the circuit and tuning is achieved through the main varactor diode 1126. The control voltage from loop filter 40 operating through junction 1060 drives the cathode of main varactor diode 1126 while the voltage from voltage converter 171 operates through series resistors 1130 and 1132 to establish the voltage at the anode of varactor diode 1126. Thus, the reverse bias voltage between the signal from loop filter 40 on the cathode and the voltage applied through the series resistor combinations to the anode allows the varactor to operate in its linear region. The capacitance change as a function of the control voltage from loop filter 40 causes tank circuit 1070 to resonate at a different frequency so that proper tuning may be achieved for the receiver mode. It should also be observed that during the receiver mode the anode of modulating diode 1099 is grounded through transistor 1142.

When, however, the transmitter is actuated through the push-to-talk switch, the transmitter 7.5 voltage source line goes high thus turning on transistor 1106. This establishes conduction through pin diode 1112 thereby coupling the parallel arrangement of capacitors 1118 and 1120 to the main varactor diode 1126 by means of junction 1122. In the transmit mode, the capacitance produced by varactor diode 1126, under the conditions of the control signal from loop filter 40, applied through junction 1060 is combined with the voltage on the anode of varactor diode 1126 from voltage converter 171. To this is added the capacitive effect of the parallel combination of capacitors 1118 and 1120. This establishes the tuning frequency for the VCO which may then be suitably combined with the multiplier in the transmit section 74 of the transceiver and thus produce correct tuning of the transmitter portion of the transceiver.

It should be observed that in either receive or transmit modes, it is the voltage applied at junction 1060 to main varactor diode 1126 in combination with the voltage at its anode operating through the series resistor circuit to terminal 1072 which determine the overall linear operating range for main varactor diode 1126. It may be seen that by altering the DC level of the voltage at junction 1072 the varactor diode range, as determined by the reverse bias voltage imposed across it, may be altered.

It may also be seen that modulation varactor diode 1099 is connected to a common junction with main tuning diode 1126 and operates in a similar manner. The audio and PL and DPL inputs are applied to the anode of this modulating varactor diode 1099. Preferably, varactor diode 1099 is considerably less sensitive than is the main tuning diode. In either transmit or receive modes, the capacitance of main varactor diode 1126 in combination with the additional capacitive parallel arrangement and without it respectively, are coupled to the tank circuit. The combined circuit elements resonate in a known fashion and provide the output to switched tank circuit 1074. JFET 1148 supplies the amplification and phase inversion which enables the oscillatory state to provide resonance in the tank circuit.

During the receive mode, to ensure that there is no modulation from either the audio input or the PL and DPL inputs, the anode of modulation varactor diode 1099 is effectively grounded through the collector to the emitter of transistor 1142. In the transmit mode, however, the operation of transistor 1106 is such that it disables transistor 1142 to allow modulation through modulation varactor diode 1099.

Figure 8:
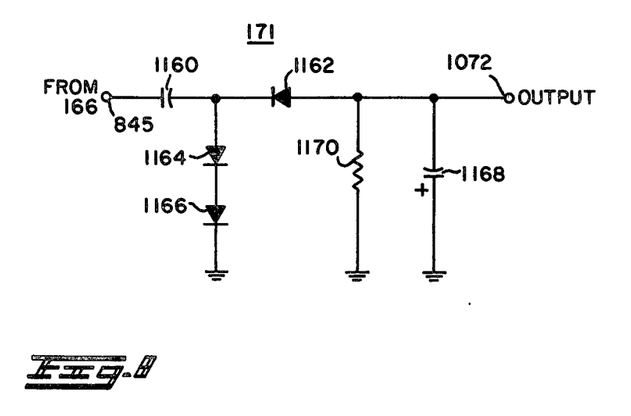
FIG. 8 is an electrical schematic of a voltage conversion circuit for the voltage controlled oscillator for the frequency synthesizer of the present invention.

FIG. 8 shows the detailed electrical schematic for voltage converter 171. The divided reference signal from terminal 845 in $M_O$ divider 166 is applied through a capacitor 1160 to the cathode of a diode 1162 to output terminal 1072. The cathode of diode 1162 is coupled to the anode of a series combination of diodes 1164 and 1166. The cathode of 1166 is coupled to ground. The anode of diode 1162 is also coupled through a capacitor 1168 and a resistor 1170 in parallel to ground. Voltage converter 171 receives the 50 KHz signal from $M_O$ divider 166 at terminal 845 which is capacitively coupled to the anode of 1164 in series with diode 1166. These diodes clip the signal at approximately two diode voltage drops above ground. Diode 1162 rectifies the negative component of the clipped signal whose voltage is stored in capacitor 1168. Capacitor 1168 filters out any remaining ripple and produces a negative voltage at output terminal 1072.

It should be noted that detailed descriptions of other circuits in the frequency synthesizer of the present invention may be found in U.S. Pat. No. 4,441,098 to Borras et al., which is assigned to the same assignee as the present application and is incorporated by reference herein.

While a specific embodiment of this invention has been shown and described, further modifications and improvements will occur to those skilled in the art. All modifications which retain the basic underlying principles and claimed herein are within the scope of this invention.

What is claimed is:

1. In a phase locked loop for a frequency synthesizer, said phase locked loop including a reference oscillator for generating a reference signal, a first divider for dividing said reference signal and generating at least one divided reference signal, a voltage controlled oscillator (VCO) having a control input, a second divider for dividing a VCO output signal, a phase detector for monitoring said divided VCO output signal and said divided reference signal and generating a first control signal to said control input of said VCO, a voltage converter, comprising:

circuit means, having an input connected to said first divider and an output connected to said control input of said VCO, for monitoring the voltage level of said divided reference signal and converting said voltage level into a second control signal which is directed to said control input of said VCO, whereby the potential across said control input of said VCO is increased, thereby increasing the tuning range of said VCO.

2. The phase locked loop of claim 1, wherein said circuit means includes means for clamping the voltage of said divided reference signal and means for converting said clamped voltage into a precise negative DC voltage for said second control signal.

3. The phase locked loop of claim 2, wherein said VCO includes a main tuning varactor diode having a cathode connected to an output of said phase detector for receiving said first control signal and an anode connected to said circuit means for receiving said precise negative DC voltage whereby the bias voltage of said main tuning varactor diode is increased, thereby increasing the tuning range of said VCO.

* * * * *